United States Patent
Sarihan et al.

(10) Patent No.: US 7,145,084 B1
(45) Date of Patent: Dec. 5, 2006

(54) RADIATION SHIELDED MODULE AND METHOD OF SHIELDING MICROELECTRONIC DEVICE

(75) Inventors: Vijay Sarihan, Paradise Valley, AZ (US); Scott M. Hayes, Chandler, AZ (US); Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 11/215,888

(22) Filed: Aug. 30, 2005

(51) Int. Cl.
*H05K 5/00* (2006.01)
*H05K 9/00* (2006.01)
(52) U.S. Cl. .................................................. 174/361
(58) Field of Classification Search .......... 174/35 GC, 174/35 R, 350, 361, 377; 361/800, 816, 361/818
See application file for complete search history.

(56) References Cited

U.S. PATENT DOCUMENTS

| | | | | |
|---|---|---|---|---|
| 5,166,772 | A | * | 11/1992 | Soldner et al. ............. 257/659 |
| 5,355,016 | A | * | 10/1994 | Swirbel et al. ............. 257/659 |
| 6,079,099 | A | * | 6/2000 | Uchida et al. ................ 29/837 |
| 6,130,592 | A | * | 10/2000 | Okihara ..................... 335/202 |
| 6,246,011 | B1 | * | 6/2001 | Abraham et al. ........... 174/260 |
| 6,377,464 | B1 | | 4/2002 | Hashemi et al. |
| 6,483,719 | B1 | | 11/2002 | Bachman |
| 6,600,101 | B1 | * | 7/2003 | Mazurkiewicz ........ 174/35 MS |
| 6,687,135 | B1 | * | 2/2004 | Kitade ........................ 361/816 |
| 6,858,795 | B1 | * | 2/2005 | Czjakowski et al. ... 174/35 MS |
| 6,881,896 | B1 | * | 4/2005 | Ebihara .................. 174/35 GC |
| 6,885,561 | B1 | * | 4/2005 | Hashemi et al. ............ 361/760 |
| 6,947,295 | B1 | * | 9/2005 | Hsieh ......................... 361/818 |
| 6,979,773 | B1 | * | 12/2005 | Fursich .................. 174/35 GC |
| 2003/0016519 | A1 | | 1/2003 | Bachman |
| 2003/0099097 | A1 | | 5/2003 | Mok et al. |
| 2004/0016995 | A1 | | 1/2004 | Kuo et al. |
| 2004/0130442 | A1 | | 7/2004 | Breed et al. |
| 2004/0223309 | A1 | | 11/2004 | Haemer et al. |
| 2005/0248927 | A1 | * | 11/2005 | Mashimo et al. .......... 361/816 |

FOREIGN PATENT DOCUMENTS

| | | | |
|---|---|---|---|
| JP | 63313899 | A * | 12/1988 |
| JP | 63314898 | A * | 12/1988 |
| JP | 01125897 | A * | 5/1989 |
| JP | 04328903 | A * | 11/1992 |

* cited by examiner

*Primary Examiner*—Dean A. Reichard
*Assistant Examiner*—Adolfo Nino (57) ABSTRACT

A radiation shielded module (120, 500, 600, 700) and method of shielding microelectronic devices (126, 412, 618, and 718) including a single interconnect substrate (110, 400, 612, 712) having a first side (122, 410, 620, 720) and a second side (124, 416, 610, 710). At least one microelectronic device is coupled to the first side of the single interconnect substrate. A shielding structure (100, 200, 300, 614, 714) is coupled to the single interconnect substrate and configured to shield radio frequency interference (RFI) and electromagnetic interference (EMI) that propagate through at least a portion of the single interconnect substrate.

10 Claims, 5 Drawing Sheets

RADIATION SHIELDED MODULE AND METHOD OF SHIELDING MICROELECTRONIC DEVICE

FIELD OF THE INVENTION

The present invention generally relates to an improved method for radiation shielding of microelectronic devices, and more particularly to packaging designs for improved radiation shielding of a single or multi-chip module.

BACKGROUND OF THE INVENTION

Single chip modules are electronic packages that contain a single microelectronic device that is coupled to an interconnect substrate. Multiple chip modules (MCMs) are electronic packages that may contain any number of discrete microelectronic devices having similar electrical characteristics and/or similar electrical paths that are coupled to a single MCM interconnect substrate. MCMs comprise at least two discrete devices encapsulated therein, for example a processor unit or a memory unit and related logic units. Additional discrete microelectronic devices that may be contained within an MCM are resistors, capacitors, inductors, and the like. The basic concept of the MCM is the interconnections between the microelectronic devices and the ability to decrease the average spacing between them and form a single package. These interconnections include connecting the input/output (I/O) conductors on the devices to the interconnect substrate, which may comprise numerous different layers to provide the interconnections between the different mounted discrete components and the interconnections needed to interface the MCM to an external application board (i.e. printed circuit board (PCB)).

Conventional single and multi chip modules function at a component level, meaning a number of discrete modules are mounted to the application board that serves as an interconnecting structure. Shielding from radiation, and more specifically from radio frequency interference (RFI) and electromagnetic interference (EMI), is required to prevent performance degradation of the individual devices within each of the modules. Many times this shielding is required due to the final application and is application specific (i.e. partial RFI/EMI shielding with cleaning capabilities or complete RFI/EMI shielding). Shielding of RFI and EMI emitted from and absorbed by the components within the module and from adjacent modules is typically achieved by placing a metal lid over the individual device or devices that serve as part of the discrete module. The metal lid is formed as a simple cavity-type structure having a planar surface and substantially perpendicular sidewalls extending therefrom about a perimeter. The lid is positioned to cover or encapsulate the devices, such that the perpendicular sidewalls rest on the surface of the interconnect substrate to which the devices are mounted. The lid may be soldered to the interconnect substrate about its perimeter. The lid is typically formed of a material that provides shielding of RFI and EMI, yet unwanted propagation of RFI and EMI has been detected at points below where the lid and interconnect substrate are coupled (i.e. through the substrate edges and through the thickness of the substrate and around the perimeter of the I/O region).

As a result of the foregoing shortcomings, conventional chip modules, including single and multi chip modules, are limited in terms of use where RFI and EMI propagation may cause a problem. Accordingly, it is desirable to provide an RFI and EMI shielded module and method of shielding of the microelectronic device or devices within a module from RFI and EMI that propagate through the interconnecting substrate. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
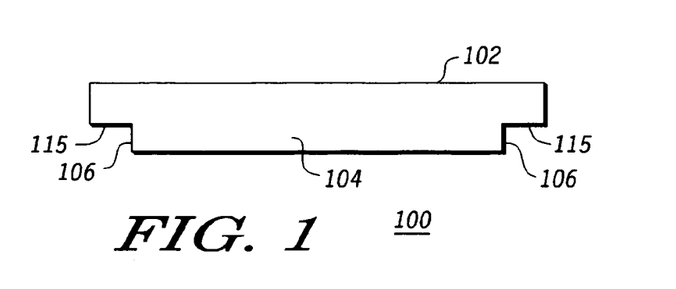
FIG. 1 is a side view of an embodiment of a shielding structure for a radiation shielded module of the present invention.

FIG. 1 is a side view of a first embodiment of a shielding structure 100 for a radiation shielded module (described below). Shielding structure 100 includes a substantially planar surface 102 and a plurality of vertical tabs 104 (of which only one is shown in FIG. 1) extending therefrom. Tab 104 in this particular embodiment includes substantially parallel sidewalls 106, oriented substantially perpendicular to the planar first surface 102. A plurality of tabs, generally similar to tab 104, are formed about a perimeter of planar surface 102, to form shielding structure 100 having a cavity-type area (not shown) formed therein. Shielding structure 100 is fabricated for placement over a plurality of microelectronic devices (described below) of the module, such that the microelectronic devices will be enclosed within or covered by the shielding structure 100. Shielding structure 100 is typically formed of radiation shielding material, e.g. copper, beryllium, and the like, that is known to shield against RFI and EMI.

Figure 2:
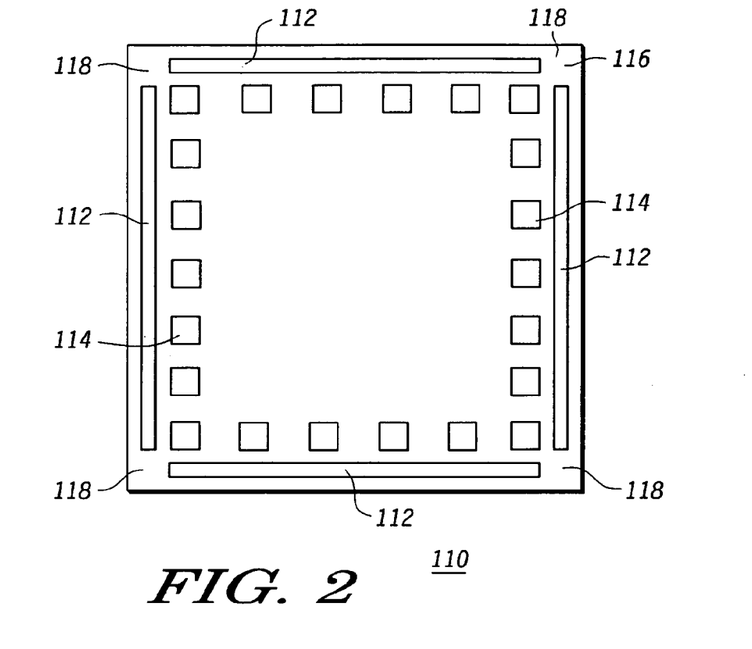
FIG. 2 is a plan view of a second side of a slotted interconnecting substrate for use with the shielding structure of FIG. 1 according to the present invention.

FIG. 2 is a plan view of a second side 116 of a slotted interconnect substrate 110 configured for use with the shielding structure 100 of FIG. 1. A plurality of microelectronic devices (described below) are mounted on an opposed first side (not shown) of substrate 110 to form in this particular embodiment, a MCM. It should be appreciated that a radiation shielded module including a single microelectronic device is anticipated by this disclosure. A plurality of interconnect pads 114 are formed on second side 116 of the slotted interconnect substrate 110, which may be a laminate material, a ceramic based material, or some other organic or inorganic material. A laminate substrate material may be preferred for ease of manufacturing, and the electrical, thermal, and mechanical properties associated with laminate materials. Interconnect substrate 110 typically includes a plurality of alternating metal and dielectric layers (not shown). Suitable dielectric materials used to produce substrate 110 include common glass-based polymers such as the fiber reinforced material BT (bismaleimide triazine), FR4 (fire retardant epoxy laminate sheets), or PTFE (polytetraflouroethylene) that has been reinforced with glass fibers, woven glass fabric, or ceramic materials. Suitable conductive metal materials used to produce substrate 110 include copper, gold, or nickel. Substrate 110, including the formation of the conductive metal lines and pads 114, may be manufactured utilizing known techniques and further discussion is not deemed necessary.

A plurality of apertures 112 are formed about the perimeter of interconnect substrate 110 in alignment with tabs 104 of FIG. 1. Alternatively, apertures 112 may be formed within a field area (not shown) of substrate 110 in alignment with tabs 104 of shielding structure 100. Apertures 112 are typically formed by drilling, deep reactive ion etching (DRIE), or laser ablation prior to assembly of the MCM. In this particular embodiment, apertures 104 have substantially the same dimensions as tabs 104, and are fabricated with close tolerance requirements to prevent leakage of RFI and EMI. Apertures 112 as illustrated are formed separate and distinct and spaced a distance apart from pads 114 to prevent shorting.

Figure 3:
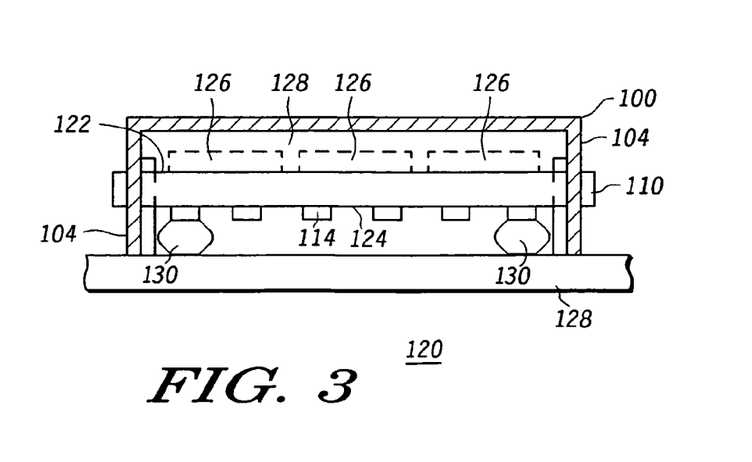
FIG. 3 is a cross-sectional view of a first embodiment of a radiation shielded module of the present invention including the shielding structure of FIG. 1 and the slotted interconnecting substrate of FIG. 2.

FIG. 3 is a cross-sectional view of a first embodiment of an assembled module 120 that includes shielding structure 100 of FIG. 1 and slotted interconnect substrate 110 of FIG. 2 having a first side 122 and a second side 124. Module 120 is configured to accommodate the use of different types of microelectronic devices 126 coupled to the first side 122 of the single interconnect substrate 110. Microelectronic devices 126 may be based on CMOS, bipolar, GaAs, or other suitable die technologies and may include resistors, capacitors, inductors, transistor packages, and the like. Devices 126 are generally mounted to substrate 110 using surface mount techniques, including, but not limited to wire bond, tape-automated bond, or flip-chip bonding. The latter is generally known to those skilled in the art, and will not be described in detail herein. Microelectronic devices 126 reside and operate in a cavity-type structure 128 within shielding structure 100.

Shielding structure 100 is coupled to substrate 110 and configured to shield radio frequency interference (RFI) and electromagnetic interference (EMI) that propagate through at least a portion of substrate 110. In this particular embodiment, shielding structure 100 is coupled to substrate 110 by aligning the plurality of tabs 104 with apertures 112 of substrate 110. Shielding structure 100 may be soldered about at least a portion of the perimeter of substrate 110, and more particularly, a plurality of portions 115 (shown in FIG. 1) of shielding structure 100 may be solder bonded to a plurality of portions 118 (shown in FIG. 2) of interconnect substrate 110. It should be appreciated that shielding structure 100 may alternatively be fixedly attached to interconnect substrate 110 by solder bonding shielding structure 100 about substantially its entire perimeter.

Tabs 104 when positioned within apertures 112 extend through the thickness of substrate 110 and contact a surface of an application board 128 as shown in FIG. 3. Module 120 is mounted to application board 128 using a plurality of solder bumps 130 formed by well known techniques. Module 120, and more specifically shielding structure 100, offers complete shielding of RFI and EMI that propagate laterally through interconnect substrate 110 and propagate laterally subsequent to (or prior to) passage through interconnect substrate 110.

Figure 4:
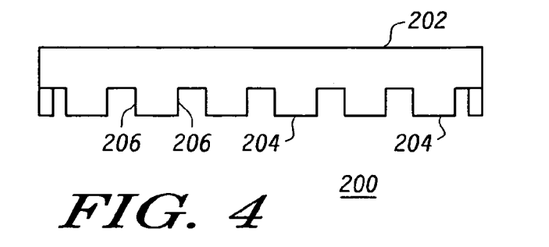
FIG. 4 is a side view of an alternative embodiment of a shielding structure for a radiation shielded module of the present invention.

FIG. 4 is a side view of a second embodiment of a shielding structure 200 for use in the radiation shielded module of the present invention. Shielding structure 200 includes a substantially planar surface 202 and a plurality of tabs 204 extending substantially perpendicularly from a perimeter thereof. Tabs 204 in this particular embodiment include substantially parallel sidewalls 206. The plurality of tabs 204 extend from planar surface 202 about a perimeter of planar surface 202 to form a cavity-type area (not shown). As previously noted, shielding structure 200 is fabricated for placement over a plurality of microelectronic devices mounted on an interconnect substrate, such that the microelectronic devices will be covered or enclosed within the shielding structure 200. Tabs 204 in this particular embodiment are formed as castellation tabs; described as having a general castle-like appearance or configuration as used in the machining industry.

Figure 5:
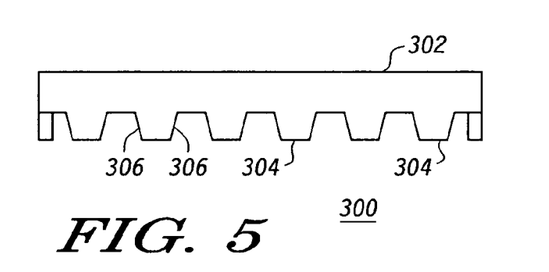
FIG. 5 is a side view of another alternative embodiment of a shielding structure for a radiation shielded module of the present invention.

FIG. 5 is a side view of a third embodiment of a shielding structure 300 for a radiation shielded module of the present invention. Shielding structure 300 is generally similar to the shielding structure 200 of FIG. 4, except in this particular embodiment, shielding structure 300 includes a substantially planar surface 302 and a plurality of tabs 304 having tapered sidewalls 306. Tabs 304 are oriented substantially perpendicularly to planar surface 302. The plurality of tabs 304 extend from planar surface 302 about the perimeter of planar surface 302, to form shielding structure 300 having a cavity-type area 518 (FIG. 8) formed therein. As noted in the prior embodiments, shielding structure 300 is fabricated for placement over a plurality of microelectronic devices mounted on an interconnect substrate (described below), such that the microelectronic devices will be covered or enclosed within shielding structure 300. Tapered sidewalls 306 allow for variance in the amount of protrusion of tabs 304 through the interconnect substrate and allow for adjustment of shielding structure 300 relative to the interconnect substrate.

Figure 6:
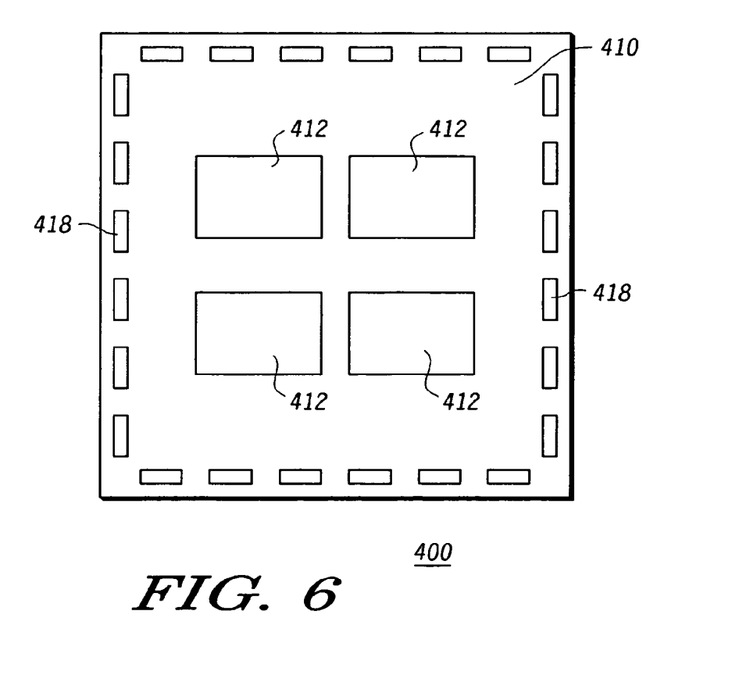
FIG. 6 is a plan view of a first side of a slotted interconnecting substrate for the shielding structure of FIG. 5 according to the present invention.

FIG. 6 is a plan view of a first side 410 of a slotted interconnect substrate 400 configured for use with the shielding structure 300 of FIG. 5. Substrate 400 has mounted on first side 410 a plurality of microelectronic devices 412, generally similar to microelectronic devices 126 of FIG. 3. In this particular embodiment, four microelectronic devices 412 are coupled to first side 410 of substrate 400 by well known surface mount techniques previously described. It should be appreciated that any number of microelectronic devices, but at least two, may be mounted to an interconnect substrate to form an module.

Figure 7:
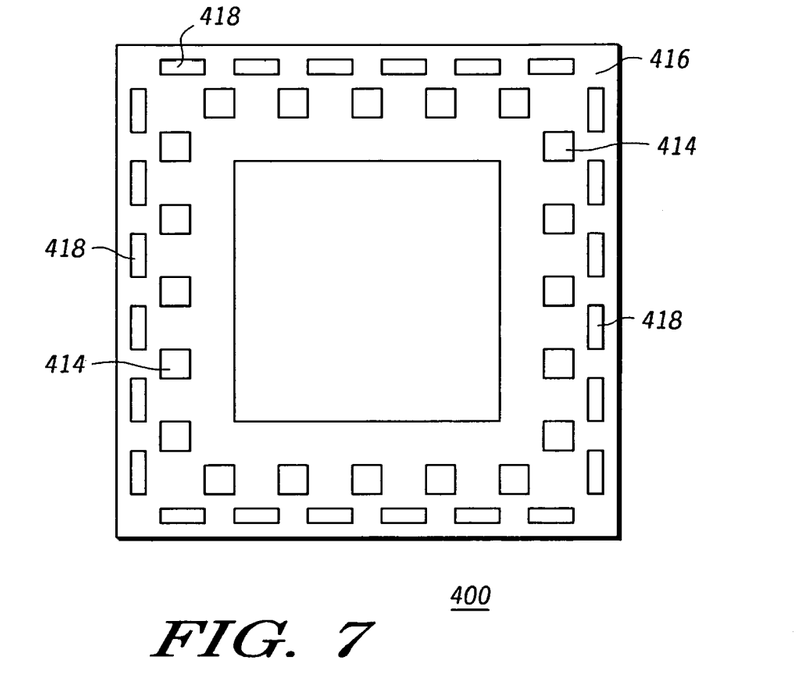
FIG. 7 is a plan view of a second side of a slotted interconnecting substrate for the shielding structures of FIG. 5 according to the present invention.

FIG. 7 is a plan view of a second side 416 of slotted interconnect substrate 400. A plurality of interconnect pads 414 are formed on second side 416 of the slotted interconnect substrate 410 and electrically coupled to microelectronic devices 412. Interconnect substrate 410 may be a laminate material, a ceramic based material, or other organic and inorganic materials as previously noted with respect to interconnect substrate 110. A plurality of apertures 418 (FIGS. 6 and 7) are formed about a perimeter of interconnect substrate 400 in alignment with tabs 304 (FIG. 5). Apertures 418 are formed in a similar manner to apertures 112 of FIG. 2 and configured to allow the tapering of tabs 304 relative to the dimension of apertures 418 to dictate the vertical placement of shielding structure 300 relative to interconnect substrate 400. Apertures 418 are formed as separate and distinct apertures spaced a distance apart from pads 414 to prevent shorting. It should be appreciated that the orientation of pads 414 is merely exemplary, and is not dependent on apertures 418 other than with respect to the described shorting.

Figure 8:
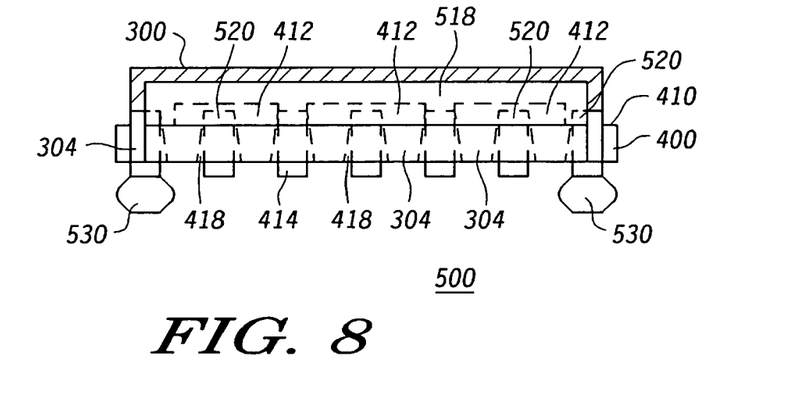
FIG. 8 is a cross-sectional view of a second embodiment of a radiation shielded module of the present invention including the shielding structure of FIG. 5 and the slotted interconnecting substrate of FIGS. 6 and 7.

FIG. 8 illustrates a cross-sectional view of a second embodiment of an assembled module 500 including shielding structure 300 of FIG. 5 and slotted interconnect substrate 400 of FIGS. 6 and 7. Module 500 includes the plurality of microelectronic devices 412 (shown in phantom) coupled to first side 410 of interconnect substrate 400. Similar to the embodiment described in FIG. 3, microelectronic devices 412 may be based on CMOS, bipolar, GaAs, or other suitable die technologies and may include resistors, capacitors, inductors, transistor packages, and the like, that are mounted to substrate 400 using surface mount techniques. A cavity-type structure 518 is defined therein shielding structure 300 within which the plurality of microelectronic devices 412 reside and operate.

Shielding structure 300 is coupled to substrate 400 and configured to shield radio frequency interference (RFI) and electromagnetic interference (EMI) that propagate laterally through at least a portion of the substrate 400. In this particular embodiment, shielding structure 300 is coupled to substrate 400 by aligning the plurality of tabs 304 with apertures 418 of substrate 400. Shielding structure 300 may be soldered about at least a portion of the perimeter of shielding structure 300 as previously described with regard to FIG. 3. Tabs 304 when positioned within apertures 418 extend through the thickness of substrate 400 to an extent allowed by the dimension of apertures 418 relative to tabs 304. More specifically, as illustrated in FIG. 8, shielding structure 300 is positioned relative to substrate 400 whereby tapered tabs 304 allow shielding structure 300 to be positioned having a plurality of gaps 520 that define fluid pathways for cleaning (i.e. defluxing) of module 500. A plurality of solder bumps 530 formed by well known solder techniques provide mounting to an application board (not shown). Module 500 offers shielding of RFI and EMI that propagate through interconnect substrate 400.

Figure 9:
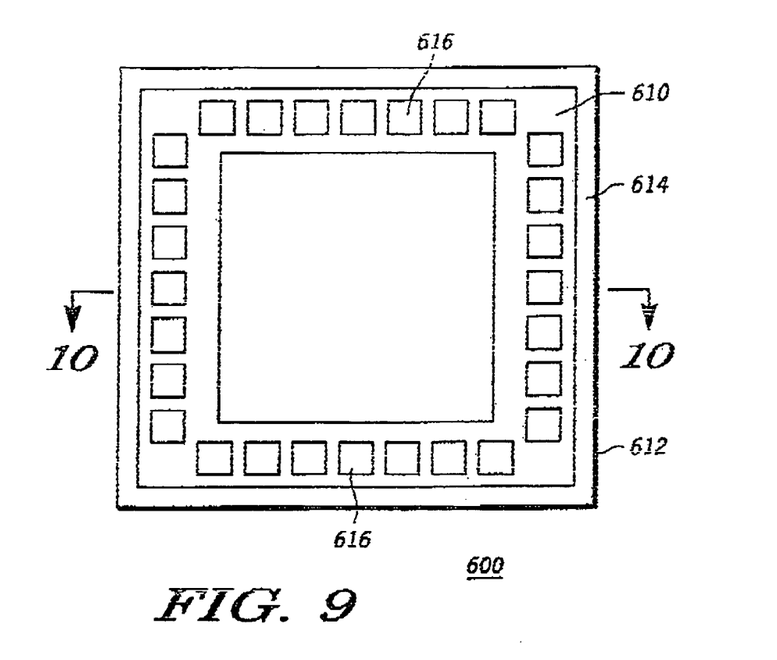
FIG. 9 is a plan view of a second side of an interconnecting substrate including a shielding solder ring according to the present invention.
Figure 10:
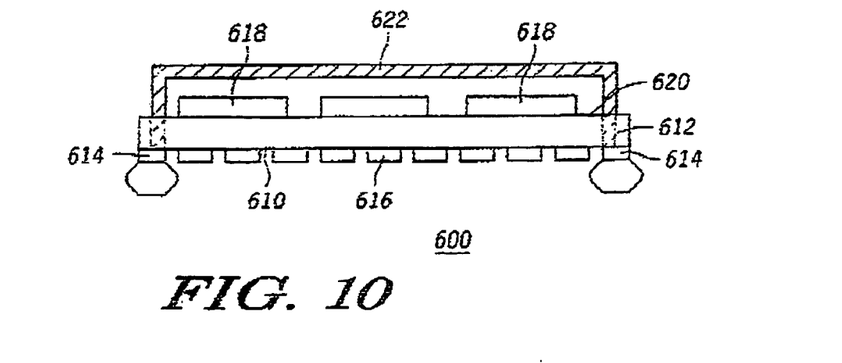
FIG. 10 is a cross-sectional view of a third embodiment of a radiation shielded module according to the present invention including the shielding solder ring of FIG. 9.

FIGS. 9 and 10 illustrate a third embodiment of a module 600 acing to the present invention. FIG. 9 illustrates in plan view a second side 610 of a single interconnect substrate 612 of module 600. FIG. 10 illustrates in cross-sectional view an assembled module 600 taken along line 10—10 of FIG. 9. Module 600 is configured to shield radio frequency interference (RFI) and electromagnetic interference (EMI) that propagate through interconnect substrate 612 by coupling a shielding solder ring 614 to second side 610. A plurality of interconnect pads 616 are formed on second side 610 of the interconnect substrate 612 and electrically coupled to a plurality of microelectronic devices 618, generally similar to microelectronic devices 126 and 412 of FIGS. 3 and 8, respectively, formed on a first side 620 of interconnect substrate 612. Interconnect substrate 600 may be a laminate material, a ceramic based material, or other organic and inorganic materials, as was previously noted with respect to interconnect substrate 110 (FIG. 1). In this particular embodiment, a lid structure 622 is positioned to protect microelectronic devices 618. Lid structure 622 provides shielding of radiation that propagates laterally through interconnect substrate 600 and is formed generally similar to the shielding structures disclosed in FIGS. 1, 4, and 5 may be used to provide increased radiation shielding in module 600. In an alternative embodiment, lid structure 622 does not provide any shielding of radiation that propagates laterally through interconnect substrate 600.

Shielding solder ring 614 is coupled to substrate 612 about a perimeter of interconnect substrate 612. Shielding solder ring 614 is formed in generally the same well known manner as standard solder pads using solder pad metallurgy. Module 600, and more specifically shielding solder ring 614, offers shielding of RFI and EMI that propagate laterally subsequent to passage through interconnect substrate 612.

Figure 11:
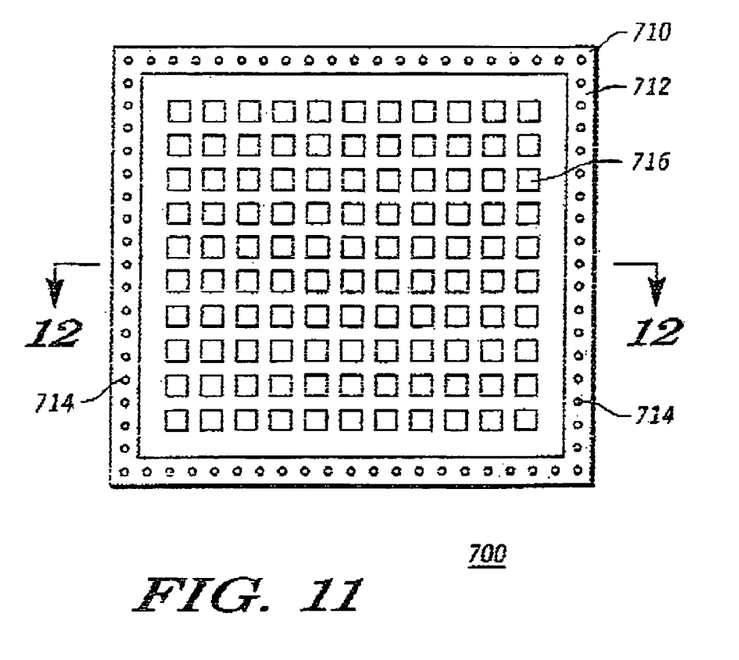
FIG. 11 is a plan view of second side of an interconnecting substrate including a plurality of shielding vias according to the present invention.
Figure 12:
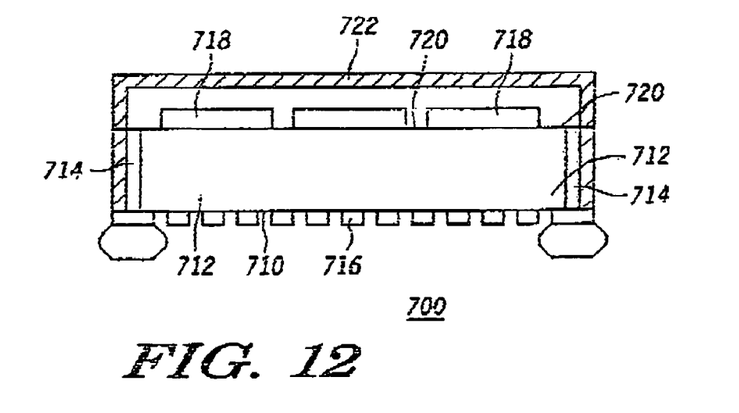
FIG. 12 is a cross-sectional view of a fourth embodiment of a radiation shielded module according to the present invention including the plurality of shielding vias of FIG. 11.

FIGS. 11 and 12 illustrate a fourth embodiment of a module 700 according to the present invention. FIG. 11 illustrates in plan view a second side 710 of a single interconnect substrate 712 of module 700. FIG. 12 illustrates in cross-sectional view assembled module 700 taken along line 12—12 of FIG. 11. Module 700 includes a plurality of shielding vias 714 coupled to the second side 710 of single interconnect substrate 712. Module 700, and more particularly shielding vias 714, are configured to shield radio frequency interference (RFI) and electromagnetic inference (EMI) that propagate through the substrate 712. A plurality of interconnect pads 716 are formed on second side 710 of the interconnect substrate 712 and electrically coupled to a plurality of microelectronic devices 718, generally similar to microelectronic devices 126, 412 and 618 of FIGS. 3, 8 and 10, respectively. Microelectronic devices 718 are formed on a first side 720 of interconnect substrate 712. Interconnect substrate 700, as previously noted with respect to interconnect substrate 110 (FIG. 1), may be a laminate (organic) material or a ceramic (inorganic) based material. In this particular embodiment, a lid structure 722 is positioned to protect microelectronic devices 718. Lid structure 722 provides radiation shielding of module 700 and is formed generally similar to the shielding structures disclosed in FIGS. 1, 4, and 5 may be used to provide increased radiation shielding in module 700. In an alternative embodiment, lid structure 722 does not provide any shielding of radiation that propagates laterally through interconnect substrate 700.

Shielding vias 714 are formed about a perimeter of interconnect substrate 712 using standard via fabrication techniques well known in the art (i.e. drilling, DRIE, laser ablation) and at least partially filled with a conductive material that provides RFI and EMI shielding (i.e. conductive polymer, silver filled epoxy, copper filled epoxy, or plated copper). Shielding vias 714 eliminate substantially all propagation of RFI and EMI laterally through interconnect substrate 712. It should be appreciated that while shielding vias 714 are shown in a substantially straight line formation about perimeter 712, alternatively shielding vias 714 may be formed offset from one another when the final application of module 700 requires such positioning or formed closer together to prevent radiation propagation between shielding vias 714.

It should be appreciated that while a single shielding structure has been shown integrated with each of the described module embodiments, any combination of the individual shielding structures disclosed may be used to provide increased radiation shielding where required (i.e. a shielding lid structure in combination with a shielding solder ring, a shielding lid structure in combination with a plurality of shielding vias, or a shielding solder ring in combination with a plurality of shielding vias).

Accordingly, provided is a shielded module comprising: a single interconnect substrate having a first side and a second side; at least one microelectronic device coupled to said first side; and a shielding structure coupled to said single interconnect substrate, a portion of which extends through to at least the second side. The shielding structure may comprise a substantially planar surface and at least one tab extending substantially vertically about a perimeter of the substantially planar surface, said shielding structure coupled to said first side and defining a cavity therein. The at least one tab may comprise a plurality of castellation tabs. The at least one tab may include a plurality of sidewalls configured substantially perpendicular to said planar surface. The at least one tab may include a plurality of tabs having tapered sidewalls. The single interconnect substrate may include a plurality of apertures configured to allow said at least one tab to extend through to at least said second side. The module may further comprise an application board, wherein the at least one tab extends through the single interconnect substrate to a surface of the application board. The module may further include a plurality of shielding vias extending from said first side substrate to said second side. The module may further include a shielding solder ring coupled about a perimeter of the multi-chip module on said second side.

In addition, provided is a radiation shielded module comprising: a single interconnect substrate having a first side and a second side; at least one microelectronic device coupled to said first side; and a plurality of shielding vias extending from said first side to said second side. The plurality of shielding vias may include a conductive material. The conductive material may be one of a conductive polymer, silver filled epoxy, copper filled epoxy, and plated copper. The plurality of shielding vias may be offset one from another. The module may further include a shielding solder ring coupled about a perimeter of the multi-chip module on said second side.

In addition, further provided is a radiation shielded module comprising: a single interconnect substrate having a first side and a second side; at least one microelectronic device coupled to said first side; and a shielding solder ring coupled about a perimeter of the module on said second side. The shielding solder ring may be formed continuous about a perimeter of said second side.

Finally, provided is a method of shielding radio frequency interference (RFI) and electromagnetic interference (EMI) in a radiation shielded module comprising the steps of: providing a single interconnect substrate having a first side, a second side and a plurality of apertures formed therein; coupling at least one microelectronic device to said single interconnect substrate on a first side; and coupling a shielding structure to said single interconnect substrate, a portion of which extends through to at least the second side. The shielding structure may include a plurality of tabs extending substantially vertically about a perimeter of a substantially planar surface and the step of coupling the shielding structure includes fixedly attaching the shielding structure to the first side of the interconnect substrate, wherein the plurality of tabs extend at least partially into the plurality of apertures. The method may further include the step of fabricating a plurality of shielding vias extending from said first side to said second side of said interconnect substrate. The method may further include the step of coupling a shielding solder ring about a perimeter of the multi-chip module on said second side.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A radiation shielded module comprising:
   a single interconnect substrate having a first side and a second side;
   at least one microelectronic device coupled to said first side;
   a cover consisting of a shielding structure coupled to said single interconnect substrate, a portion of which extends through to at least the second side, said shielding structure comprising a substantially planar surface and at least one tab extending substantially vertically about a perimeter of the substantially planar surface, said shielding structure coupled to said first side and defining a cavity therein; and
   a shielding solder ring coupled about a perimeter of the radiation shielded module on said second side.

2. The module of claim (1), wherein said at least one tab comprises a plurality of castellation tabs.

3. The module of claim (1), wherein said at least one tab includes a plurality of sidewalls configured substantially perpendicular to said planar surface.

4. The module of claim (1), wherein said at least one tab includes a plurality of tabs having tapered sidewalls.

5. The module of claim (1), wherein said single interconnect substrate includes a plurality of apertures configured to allow said at least one tab to extend through to at least said second side.

6. The module of claim (1), further comprising an application board, wherein the at least one tab extends through the single interconnect substrate to a surface of the application board.

7. The module of claim (1), further including a plurality of shielding vias extending from said first side of the substrate to said second side.

8. A method of shielding radio frequency interference (RFI) and electromagnetic interference (EMI) in a radiation shielded module comprising the steps of:
   providing a single interconnect substrate having a first side, a second side and a plurality of apertures formed therein;

coupling at least one microelectronic device to said single interconnect substrate on the first side;

coupling a cover consisting of a shielding structure to said single interconnect substrate, a portion of which extends through to at least the second side, the shielding structure including a plurality of tabs extending substantially vertically about a perimeter of a substantially planar surface and the step of coupling the shielding structure includes fixedly attaching the shielding structure to the first side of the interconnect substrate, wherein the plurality of tabs extend at least partially into the plurality of apertures; and coupling a shielding solder ring about a perimeter of the radiation shielded module on said second side.

9. The method of claim 8, further including the step of fabricating a plurality of shielding vias extending from said first side to said second side of said interconnect substrate.

10. A radiation shielded module comprising:
- a single interconnect substrate having a first side and a second side;
- at least one microelectronic device coupled to said first side;
- a cover consisting of a shielding structure coupled to said single interconnect substrate, a portion of which extends through to at least the second side; and
- a shielding solder ring coupled about a perimeter of the radiation shielded module on said second side.

* * * * *